(12) United States Patent
Zhang et al.

(10) Patent No.: US 11,322,724 B2
(45) Date of Patent: May 3, 2022

(54) DISPLAY SUBSTRATE HAVING MICROCAVITY STRUCTURE, FABRICATING METHOD THEREOF AND DISPLAY DEVICE

(71) Applicant: BOE TECHNOLOGY GROUP CO., LTD., Beijing (CN)

(72) Inventors: Can Zhang, Beijing (CN); Can Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 287 days.

(21) Appl. No.: 16/494,443

(22) PCT Filed: Feb. 27, 2019

(86) PCT No.: PCT/CN2019/076224
§ 371 (c)(1),
(2) Date: Sep. 16, 2019

(87) PCT Pub. No.: WO2019/223378
PCT Pub. Date: Nov. 28, 2019

(65) Prior Publication Data
US 2021/0336221 A1    Oct. 28, 2021

(30) Foreign Application Priority Data

May 25, 2018   (CN) .......................... 201810513425.0

(51) Int. Cl.
*H01L 29/08*   (2006.01)
*H01L 51/52*   (2006.01)
(Continued)

(52) U.S. Cl.
CPC ........ *H01L 51/5265* (2013.01); *H01L 27/322* (2013.01); *H01L 51/5253* (2013.01); *H01L 51/56* (2013.01)

(58) Field of Classification Search
CPC .................................................... H01L 51/5265
See application file for complete search history.

(56) References Cited

U.S. PATENT DOCUMENTS 6,366,017 B1 * 4/2002 Antoniadis ......... H01L 51/5203
313/113
6,590,711 B1 * 7/2003 Gardner ................... G02B 1/14
359/599

(Continued)

FOREIGN PATENT DOCUMENTS

| CN | 1805161 A | 7/2006 |
| CN | 101365271 A | 2/2009 |

(Continued)

*Primary Examiner* — Caleb E Henry
(74) *Attorney, Agent, or Firm* — Myers Bigel, P.A.

(57) ABSTRACT

The present disclosure relates to the field of display, and specifically provides a display substrate, a fabricating method thereof, and a corresponding display device. The display substrate includes a first transparent electrode and a second reflective electrode opposite to each other, a light emitting layer between the first transparent electrode and the second reflective electrode, an organic material layer on a side of the first transparent electrode away from the light emitting layer, and a transflective layer on a side of the organic material layer away from the light emitting layer.

18 Claims, 3 Drawing Sheets

(51) Int. Cl.
*H01L 27/32* (2006.01)
*H01L 51/56* (2006.01)

(56) References Cited

U.S. PATENT DOCUMENTS

| | | | |
|---|---|---|---|
| 7,923,920 B2* | 4/2011 | Nakamura | H01L 51/5271 |
| | | | 313/504 |
| 8,963,138 B2* | 2/2015 | Lim | H01L 51/5275 |
| | | | 257/40 |
| 9,166,204 B2* | 10/2015 | Park | H01L 51/56 |
| 9,570,701 B2* | 2/2017 | Lee | H01L 51/5265 |
| 9,786,720 B2* | 10/2017 | Kim | H01L 51/52 |
| 10,211,417 B2* | 2/2019 | Kim | H01L 51/504 |
| 10,229,954 B2* | 3/2019 | Park | H01L 51/5044 |
| 10,256,438 B2* | 4/2019 | Kim | H01L 51/5253 |
| 2006/0097264 A1 | 5/2006 | Kim et al. | |
| 2006/0187387 A1* | 8/2006 | Ohyama | G02F 1/13363 |
| | | | 349/114 |
| 2008/0067926 A1* | 3/2008 | Mizuno | H01L 51/5265 |
| | | | 313/504 |
| 2008/0273149 A1* | 11/2008 | Jeng | G02F 1/13363 |
| | | | 349/114 |
| 2009/0039777 A1 | 2/2009 | Oda | |
| 2009/0251051 A1* | 10/2009 | Hwang | H01L 27/3213 |
| | | | 313/504 |
| 2011/0187260 A1* | 8/2011 | Fukuda | H05B 33/22 |
| | | | 313/114 |
| 2011/0187261 A1* | 8/2011 | Fukuda | H01K 1/26 |
| | | | 313/114 |
| 2011/0198629 A1* | 8/2011 | Lee | H01L 27/322 |
| | | | 257/89 |
| 2011/0285949 A1* | 11/2011 | Imayama | G02F 1/133555 |
| | | | 349/138 |
| 2012/0206675 A1* | 8/2012 | Seo | H01L 51/5265 |
| | | | 349/96 |
| 2012/0257134 A1* | 10/2012 | Sun | G02F 1/133555 |
| | | | 349/43 |
| 2013/0146861 A1 | 6/2013 | Kurata et al. | |
| 2013/0285023 A1* | 10/2013 | Kurata | H01L 51/56 |
| | | | 257/40 |
| 2014/0027732 A1* | 1/2014 | Pyo | H01L 51/5265 |
| | | | 257/40 |
| 2014/0159007 A1* | 6/2014 | Song | H01L 27/3213 |
| | | | 257/40 |
| 2014/0159009 A1* | 6/2014 | Song | H01L 51/56 |
| | | | 257/40 |
| 2014/0159012 A1* | 6/2014 | Song | H01L 51/5265 |
| | | | 257/40 |
| 2014/0159020 A1* | 6/2014 | Song | H01L 51/5265 |
| | | | 257/40 |
| 2014/0159021 A1* | 6/2014 | Song | H01L 51/5265 |
| | | | 257/40 |
| 2014/0167005 A1* | 6/2014 | Kim | H01L 27/322 |
| | | | 257/40 |
| 2015/0090972 A1* | 4/2015 | Lee | H01L 51/5265 |
| | | | 257/40 |
| 2016/0013412 A1* | 1/2016 | Harikrishna Mohan | H01L 51/525 |
| | | | 438/29 |
| 2017/0084644 A1* | 3/2017 | Kang | H01L 27/124 |
| 2020/0012146 A1* | 1/2020 | Lin | G02F 1/133528 |
| 2020/0044125 A1* | 2/2020 | Chen | H01L 33/58 |

FOREIGN PATENT DOCUMENTS

| | | |
|---|---|---|
| CN | 103081568 A | 5/2013 |
| CN | 108682681 A | 10/2018 |

* cited by examiner

DISPLAY SUBSTRATE HAVING MICROCAVITY STRUCTURE, FABRICATING METHOD THEREOF AND DISPLAY DEVICE

CROSS REFERENCE TO RELATED APPLICATIONS

The present application is a 35 U.S.C. 371 national stage application of the PCT international Application No. PCT/CN2019/076224 filed on Feb 27, 2019, which claims the benefit of Chinese Patent Application No. 201810513425.0 filed on May 25, 2018, the entire disclosure of which is disclosures of both are incorporated herein by reference.

TECHNICAL FIELD

The present disclosure relates to the field of display technology, and in particular to a display substrate, a fabricating method thereof, and a corresponding display device.

BACKGROUND

With relatively small size and good display performance, micro displays have shown an increasingly broad application prospect, and are particularly suitable for applications such as head-mounted displays, stereo displays, and glasses displays. Typically, micro displays can be implemented by using organic light emitting devices (OLEDs), liquid crystal display devices (LCDs), micro-light emitting diode (micro-LED) display devices, microelectromechanical systems (MEMS), and the like. Due to advantages of fast response, high contrast, self-luminescence, simple structure, and low power consumption, organic light emitting devices have favorable application prospects in micro displays.

In general, when an organic light emitting device is used in a micro display, full-color display can be realized by using a combination of white light and a color film substrate. However, due to limitations of fine metal mask (FMM), in such a color organic light emitting device, it is difficult to achieve a relatively large number of pixels per inch (PPI). In addition, for such an organic light emitting device where white light and a color film substrate are combined, the finally output light has only a color gamut which is about 80% of the NTSC color gamut. Obviously, this severely limits advantages such as high color gamut of the organic light emitting device.

SUMMARY

According to an aspect of the present disclosure, a display substrate is provided. Specifically, the display substrate comprises: a first transparent electrode and a second reflective electrode opposite to each other; a light emitting layer between the first transparent electrode and the second reflective electrode; an organic material layer on a side of the first transparent electrode away from the light emitting layer; and a transflective layer on a side of the organic material layer away from the light emitting layer. The organic material layer comprises a plurality of organic material portions in an array, and each organic material portion comprises more than one organic material sub-portion. Each organic material sub-portion in each organic material portion has a different thickness in a direction perpendicular to an extending surface of the organic material layer, such that a distance between a portion of the second reflective electrode and a portion of the transflective layer corresponding to each organic material sub-portion is different, thereby emitting light of a different color from each organic material sub-portion.

According to a specific implementation, in the display substrate provided by an embodiment of the present disclosure, the transflective layer is in direct contact with the organic material layer.

According to a specific implementation, the display substrate provided by an embodiment of the present disclosure further comprises: a plurality of color filter units on a side of the transflective layer away from the light emitting layer. Specifically, each color filter unit comprises more than one color filter sub-unit, wherein an orthographic projection of each of the more than one color filter sub-unit on the organic material layer coincides with a respective one of the more than one organic material sub-portion.

According to a specific implementation, the display substrate provided by an embodiment of the present disclosure further comprises a first encapsulation layer, for example, a thin film encapsulation layer. Specifically, the first encapsulation layer is located between the first transparent electrode and the organic material layer.

According to a specific implementation, the display substrate provided by an embodiment of the present disclosure further comprises a second encapsulation layer, for example, an inorganic encapsulation layer. Specifically, the second encapsulation layer is located on a side of the transflective layer away from the light emitting layer.

According to a specific implementation, in the display substrate provided by an embodiment of the present disclosure, the organic material layer is made of parylene, polydimethylsiloxane or polymethyl methacrylate.

According to a specific implementation, in the display substrate provided by an embodiment of the present disclosure, the transflective layer comprises a distributed Bragg mirror, an MgAg layer, an Al layer or an Au layer.

According to a specific implementation, in the display substrate provided by an embodiment of the present disclosure, the more than one organic material sub-portion comprises a first organic material sub-portion, a second organic material sub-portion, and a third organic material sub-portion.

According to a specific implementation, in the display substrate provided by an embodiment of the present disclosure, the light emitting layer comprises a first light emitting sub-layer, a second light emitting sub-layer, and a third light emitting sub-layer disposed in a stack. Further, the first light emitting sub-layer is configured to emit red light, the second light emitting sub-layer is configured to emit green light, and the third light emitting sub-layer is configured to emit blue light.

According to a specific implementation, in the display substrate provided by an embodiment of the present disclosure, the thicknesses of the first organic material sub-portion, the second organic material sub-portion, and the third organic material sub-portion in the direction perpendicular to the extending surface of the organic material layer are chosen such that red light, green light, and blue light are emitted out from the first organic material sub-portion, the second organic material sub-portion, and the third organic material sub-portion respectively.

According to a specific implementation, the display substrate provided by an embodiment of the present disclosure further comprises at least one of an electron injection layer and an electron transport layer between the light emitting layer and the first transparent electrode.

According to a specific implementation, the display substrate provided by an embodiment of the present disclosure further comprises at least one of a hole injection layer and a hole transport layer between the light emitting layer and the second reflective electrode.

According to another aspect of the present disclosure, a display device is also provided. The display device comprises the display substrate described in any of the preceding embodiments.

According to yet another aspect of the present disclosure, a method for fabricating a display substrate is also provided. Specifically, the method comprises the steps of: providing a first transparent electrode and a second reflective electrode opposite to each other; forming a light emitting layer between the first transparent electrode and the second reflective electrode; forming an organic material layer on a side of the first transparent electrode away from the light emitting layer, such that the organic material layer comprises a plurality of organic material portions arranged in an array, each organic material portion comprising more than one organic material sub-portion; and forming a transflective layer on a side of the organic material layer away from the light emitting layer. Each organic material sub-portion in each organic material portion is further formed to have a different thickness in a direction perpendicular to an extending surface of the organic material layer, such that a distance between a portion of the second reflective electrode and a portion of the transflective layer corresponding to each organic material sub-portion is different, thereby emitting light of a different color from each organic material sub-portion.

According to a specific implementation, in the method for fabricating a display substrate provided by an embodiment of the present disclosure, the organic material layer is formed on the side of the first transparent electrode away from the light emitting layer by a spin coating process.

According to a specific implementation, in the method for fabricating a display substrate provided by an embodiment of the present disclosure, the organic material layer is imprinted by a nano-imprint process into the plurality of organic material portions arranged in an array.

According to a specific implementation, in the method for fabricating a display substrate provided by an embodiment of the present disclosure, the transflective layer is formed on the side of the organic material layer away from the light emitting layer by an evaporation process.

DETAILED DESCRIPTION OF THE DISCLOSURE

Figure 1:
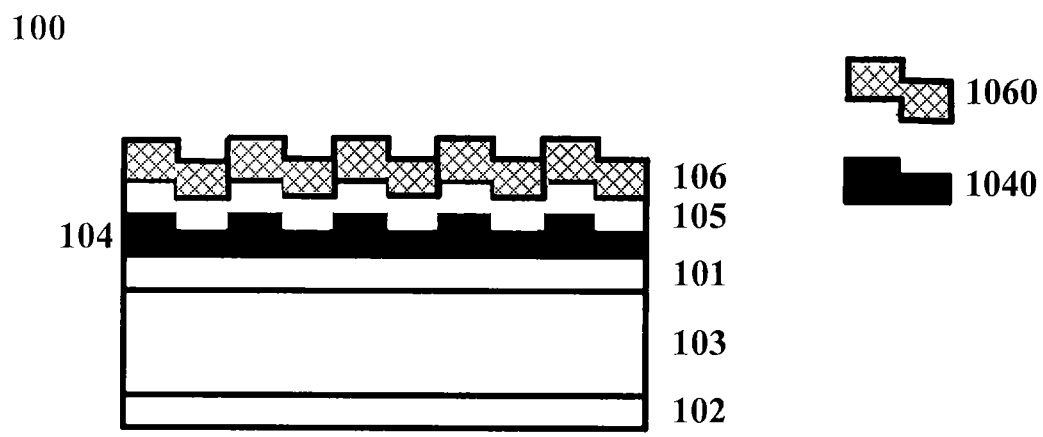
FIG. 1 schematically shows a cross-sectional view of a display substrate according to an embodiment of the present disclosure.

The display substrate, the fabricating method thereof and the corresponding display device provided by embodiments of the present disclosure will be described in detail below with reference to the accompanying drawings.

Prior to the detailed description, it should be noted that the same or similar reference numbers are used throughout various drawings of the present application to refer to components having the same structure or function. Further, the leftmost digit in the reference number indicates the drawing in which the reference number first appears. It should also be noted that although various components of the display substrate according to embodiments of the present disclosure are illustrated to be spaced apart in the drawings, this does not represent any limitation to the present disclosure. In fact, it will be readily apparent to those skilled in the art, having benefited from teachings of the present disclosure, that all of these components in the display substrate can be bonded with one another in any suitable connection or coupling way. Therefore, the display substrate can operate normally as a whole. In addition, it should be understood that although various components of the display substrate according to embodiments of the present disclosure are shown in a particular absolute or relative size, this should not be construed as limiting the present disclosure. In fact, those skilled in the art, having benefited from teachings of the present disclosure, can flexibly design or select any suitable size according to actual needs.

Figure 2:
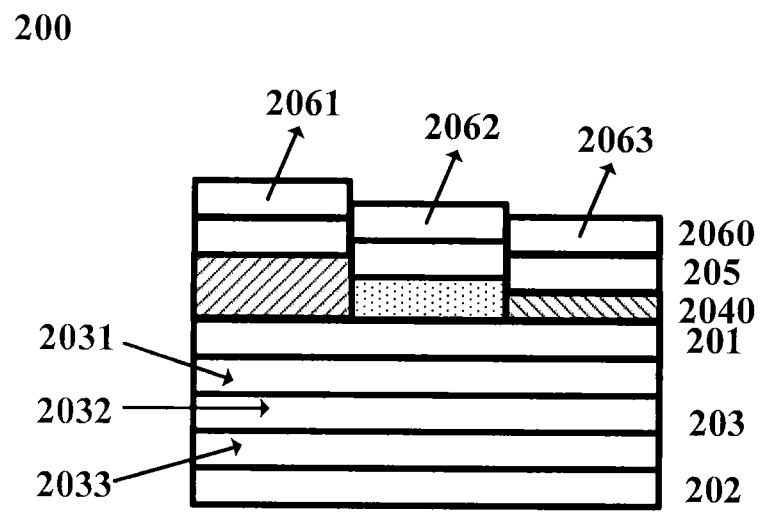
FIG. 2 schematically shows a partial cross-sectional view of a display substrate according to another embodiment of the present disclosure.

Referring to FIG. 1, a cross-sectional view of a display substrate according to an embodiment of the present disclosure is schematically illustrated. Specifically, the display substrate 100 may comprise a second reflective electrode 102, a light emitting layer 103, a first transparent electrode 101, an organic material layer 104, a transflective layer 105, and an array of optional color filter units 1060, all of which are stacked from bottom to top. As an advantageous example, in the display substrate provided by an embodiment of the present invention, the transflective layer 105 is in direct contact with the organic material layer 104. Further, the organic material layer 104 may comprise a plurality of organic material portions 1040 in an array, wherein each organic material portion 1040 may further comprise more than one organic material sub-portion having different thicknesses (i.e., thicknesses in a direction perpendicular to an extending plane of the entire display substrate). For example, two sub-portions having different thicknesses are schematically shown in FIG. 1. Apparently, it should be noted that, in addition to the two sub-portions shown in FIG. 1, each organic material portion 1040 may alternatively comprise any other number of sub-portions, for example, three, as shown in FIG. 2, and the present disclosure is not limited in this respect.

It can be seen that, in the display substrate 100 provided by an embodiment of the present disclosure, the second electrode 102 at bottom is set to be reflective, and correspondingly the transflective layer 105 is disposed on the top of the display substrate 100. In this way, a microcavity structure is formed inside the display substrate 100. That is, the second reflective electrode 102 and the transflective layer 105 constitute respectively two cavity mirrors of the microcavity structure. In this case, since the second electrode 102 is reflective, while the transflective layer 105 is partially reflective and partially transmissive, at least a portion of the light emitted by the light emitting layer 103

(e.g., a portion having a specific wavelength or color component) will be enhanced because of resonance between the two mirrors and finally exit from the transflective layer 105. According to the working principle of microcavity, the color or wavelength of the light that produces the resonance enhancement effect in the microcavity is determined by the cavity length of the microcavity (i.e., the distance between the two mirrors (the second reflective electrode 102 and the transflective layer 105)). This means that when the microcavities are designed to have different cavity lengths, the light output from the exit mirror (i.e., the transflective layer 105) will have different wavelengths or colors. In view of the above mentioned principle, the present disclosure achieves the light output of different colors, thereby contributing to a color display. Specifically, as shown in FIG. 1, the light emitting layer 103 may be configured to provide white light, for example by mixing light of different colors. As an example, the light emitting layer 103 may be formed of various organic material layers. Alternatively, the light emitting layer 103 may also be formed of various quantum dot light emitting layers. Further, each of the organic material portions 1040 in the organic material layer 104 comprises a plurality of sub-portions of different thicknesses, for example, two sub-portions as shown in FIG. 1. In this case, microcavities of two different lengths will be formed within the display substrate 100, wherein one microcavity corresponds to a thicker sub-portion (e.g., a sub-portion on the left side) of the organic material portion 1040, and the other microcavity corresponds to a thinner sub-portion (e.g., a sub-portion on the right side) of the organic material portion 1040. Obviously, since the two organic material sub-portions are different in thickness, the two microcavities thus formed will have different cavity lengths, resulting in different colors of light output from them. In this way, in the display substrate provided by an embodiment of the present disclosure, microcavities having different cavity lengths can be formed, thus achieving simultaneous output of different colors of light from the display substrate, and contributing to a color display.

Next, a specific structure of a display substrate and a working process thereof according to an embodiment of the present disclosure will be explained in more detail with reference to FIG. 2. It is to be noted that, for the sake of clarity, in FIG. 2, no complete cross-sectional view of the entire display substrate is shown. Instead, only a cross-sectional view of a portion of the display substrate corresponding to one organic material portion is shown in FIG. 2. That is, the cross-sectional view of the entire display substrate can be considered as some repetition of the partial cross-sectional view shown in FIG. 2, in particular, repetition of the organic material portions in an array distribution.

Similar to the display substrate 100 shown in FIG. 1, in the embodiment shown in FIG. 2, the display substrate 200 may also comprise a second reflective electrode 202, a light emitting layer 203, a first transparent electrode 201, an array of organic material portions 2040, a transflective layer 205, and an array of optional color filter units 2060, all of which are stacked from bottom to top. As a specific embodiment, in the display substrate 200 shown in FIG. 2, the light emitting layer 203 may comprise three light emitting sub-layers 2031, 2032, and 2033 which are stacked over each other. Advantageously, the three light emitting sub-layers 2031, 2032 and 2033 may be configured to emit red, green and blue light, respectively. This means that light emitted from the entire light emitting layer 203 will be mixed light of red, green and blue light, such as white light. Further, in the embodiment shown in FIG. 2, each of the organic material portions 2040 may further comprise three organic material sub-portions 2041, 2042, and 2043 having different thicknesses.

In this case, when voltages are applied to the first transparent electrode 201 and the second reflective electrode 202, red, green, and blue light will be emitted from the three light emitting sub-layers 2031, 2032, and 2033 respectively. Thus, after mixing, for example, white light will be incident on the first transparent electrode 201 and further transmitted to the organic material portions. In this case, since each of the organic material sub-portions 2041, 2042, and 2043 in each organic material portion 2040 has a different thickness, three microcavity structures will be formed between the transflective layer 205 and the second reflective electrode 202, which three microcavity structures correspond to the three organic material sub-portions 2041, 2042 and 2043 respectively. In such a case, based on relevant calculations in the microcavity, for example, the cavity length of the microcavity corresponding to the first organic material sub-portion 2041 (i.e., the distance between a portion of the second reflective electrode 102 and a portion of the transflective layer 105 coinciding with the vertical projection of the first organic material sub-portion 2041) may be selected, such that the exit light enhanced by resonance is red in color. In a similar manner, cavity lengths of the microcavities corresponding to the second organic material sub-portion 2042 and the third organic material sub-portion 2043 (i.e., distances between portions of the second reflective electrode 102 and portions of the transflective layer 105 coinciding with the vertical projections of the second organic material sub-portion 2042 and the third organic material sub-portion 2043 respectively) can be calculated, such that the exit light enhanced by resonance is respectively green and blue in color. Thus, simultaneous output of red, green and blue light is achieved, and the entire display substrate can be used for RGB color display.

Further, referring to FIGS. 1 and 2, in optional embodiments, the display substrates 100, 200 may further comprise an array of color filter units 1060, 2060. As an example, these color filter units 1060, 2060 may be disposed on the outermost side of the entire display substrate 100, 200, such as on a side of the transflective layers 105, 205 away from the light emitting layers 103, 203 (i.e., on the top of the figure). Moreover, like the organic material portion 2040, in the display substrate 200 shown in FIG. 2, each color filter unit 2060 may also comprise three color filter sub-units 2061, 2062, and 2063, and the three color filter sub-units 2061, 2062, and 2063 are disposed corresponding respectively to the three sub-portions 2041, 2042, and 2043 of the organic material portion 2040. That is, the vertical projections thereof coincide with each other. In case that thicknesses of the first organic material sub-portion 2041, the second organic material sub-portion 2042, and the third organic material sub-portion 2043 are chosen to provide red, green, and blue light outputs respectively, the three color filter sub-units 2061, 2062, and 2063 that are disposed correspondingly can be configured to transmit the red, green, and blue light respectively. In this way, the output light enhanced by microcavity resonance can be further filtered in wavelength distribution, so as to output more pure colors, such as red, green, and blue. Also, light output of the entire display substrate can be improved in color gamut. Apparently, having benefited from teachings of the present disclosure, those skilled in the art will appreciate that the color filter units and their various sub-units listed herein as examples are merely optional, and are not necessarily required. For example, if the output light already has a relatively pure color by the resonance enhancement effect in the microcavity of a particular cavity length, the additional color filter sub-unit of the respective color can be omitted. This means that in the outermost array of color filter units, there may be only one or more color filter sub-units of respective colors, and the present disclosure should cover all such equivalent technical solutions.

Herein, it should also be noted that, due to the specific selectivity of the wavelength or color of light by the microcavity, and the resonance enhancement effect on intensity, by introducing microcavity structures into the display substrate, the final output light has a better color gamut and higher light extraction efficiency in embodiments of the present disclosure as compared to the conventional microcavity-free display substrate, thereby contributing to an excellent display effect. In addition, it should also be noted that in the display substrate provided by embodiments of the present disclosure, different cavity lengths of the microcavity structure are realized by different thicknesses of several sub-portions of the organic material layer inside the device. This means that in the provided display substrate, both the anode and the cathode remain the same design as that in a conventional device without a microcavity structure. Therefore, there is no need to form anode structures of different thicknesses by for example multiple mask processes, thereby making the fabrication process simpler.

It should be appreciated by those skilled in the art that although the organic material layer in the display substrate comprises three organic material sub-portions, as schematically illustrated in FIG. 2, the present disclosure is not limited thereto. For example, in an alternative embodiment, the organic material layer may comprise four organic material sub-portions, and the four organic material sub-portions may be respectively configured to have different thicknesses, such that red, green, blue and yellow light are output from the four organic material sub-portions respectively, thereby realizing RGBY color display. It is to be understood that the RGB and RGBY color displays provided by way of example are only used to explain the principle of the present disclosure, and should not be construed as limiting the present disclosure. In fact, those skilled in the art, having benefited from teachings of the present disclosure, can select any type of multi-pixel color display that is currently available or may be developed in the future according to actual needs, and this will not be further described herein.

Figure 3:
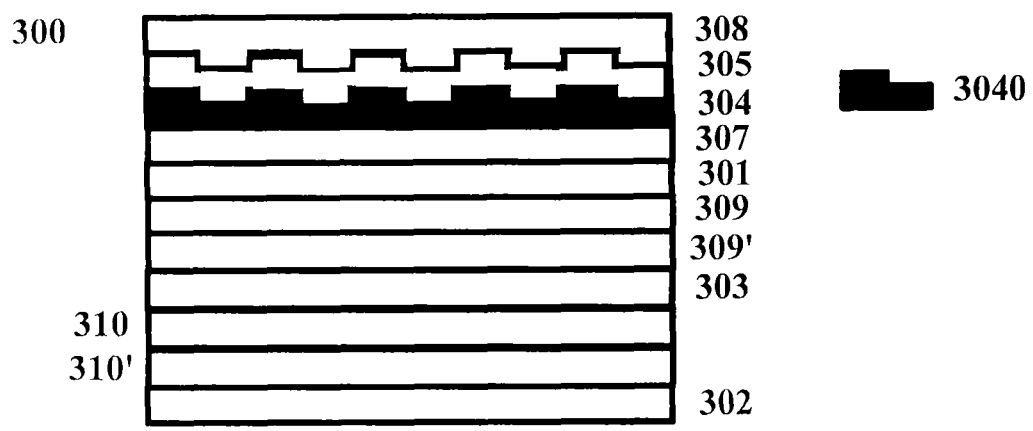
FIG. 3 schematically shows a cross-sectional view of a display substrate according to yet another embodiment of the present disclosure.

Referring to FIG. 3, a cross-sectional view of a display substrate according to yet another embodiment of the present disclosure is schematically illustrated. Similar to the display substrate described above with reference to FIGS. 1 and 2, in FIG. 3, the display substrate 300 may also comprise a first transparent electrode 301, a second reflective electrode 302, a light emitting layer 303, an organic material layer 304 comprising a plurality of organic material sub-portions 3040, and a transflective layer 305. However, as compared with the above two embodiments, in FIG. 3, the display substrate 300 may further comprise a first encapsulation layer 307 and a second encapsulation layer 308. For example, the first encapsulation layer 307 may be a thin film encapsulation layer, and the second encapsulation layer 308 may be an inorganic encapsulation layer. Specifically, the first encapsulation layer 307 may be disposed between the first transparent electrode 301 and the organic material layer 304, and configured to encapsulate the core light emitting portion of the entire display substrate 300 (e.g., comprising the first transparent electrode 301, the second reflective electrode 302 and the light emitting layer 303), so as to prevent adverse effects on the light emitting performance of the display substrate 300 caused for example by changes in environmental factors such as temperature, humidity, and the like. Unlike the first encapsulation layer 307, the second encapsulation layer 308 may be disposed on the outermost side of the entire display substrate 300, for example, on the outer side of the transflective layer 305 (i.e., the side away from the light emitting layer 303), thereby providing an entire encapsulation for the display substrate 300. Herein, it should be noted that although a thin film encapsulation layer is used to encapsulate the core light emitting portion of the display substrate 300 in descriptions of the present disclosure, those skilled in the art will understand that any other suitable inorganic or organic material may be used to achieve such a encapsulating purpose, and the present disclosure is intended to cover all such possible equivalent technical solutions. Further optionally, in the display substrate 300 shown in FIG. 3, one or more of an electron injection layer 309, an electron transport layer 309', a hole injection layer 310, and a hole transport layer 310' may be further comprised. Advantageously, the display substrate comprises all of them. Specifically, the electron injection layer 309 and the electron transport layer 309' may be formed between the first transparent electrode 301 and the light emitting layer 303, while the hole injection layer 310 and the hole transport layer 310' may be formed between the light emitting layer 303 and the second reflective electrodes 302. Obviously, those skilled in the art should readily appreciate that the formation positions of the electron injection layer 309, the electron transport layer 309', the hole injection layer 310, and the hole transport layer 310' provided by the above examples are merely examples, and the present disclosure should never be limited only to it. In fact, having benefited from the spirit and teachings of the present disclosure, those skilled in the art can flexibly dispose one or more of the electron injection layer 309, the electron transport layer 309', the hole injection layer 310, and the hole transport layer 310' based on practical experience, and the present disclosure is intended to cover all such equivalent technical solutions.

As an example, in the display substrate provided by an embodiment of the present disclosure, the organic material layer may be formed of parylene having a refractive index of about 1.8. Alternatively, in other embodiments, the transflective layer in the display substrate may comprise a distributed Bragg mirror or a layer formed by MgAg. Further, the first transparent electrode may be made of, for example, indium tin oxide (ITO) or indium zinc oxide (IZO), while the second reflective electrode may be made of, for example, a highly reflective material such as silver (Ag). For the thin film encapsulation layer, for example, materials such as alumina ($Al_2O_3$) or silicon nitride can be used. Further, the inorganic encapsulation layer may be made of silicon nitride such as SiNx. It is to be understood that the specific materials used for the various layers are set forth by way of example only, and are not intended to limit the present disclosure. In fact, having benefited from teachings of the present disclosure, those skilled in the art should be able to flexibly select any suitable material according to actual needs, and the present disclosure should cover all such equivalent technical solutions.

Figure 4:
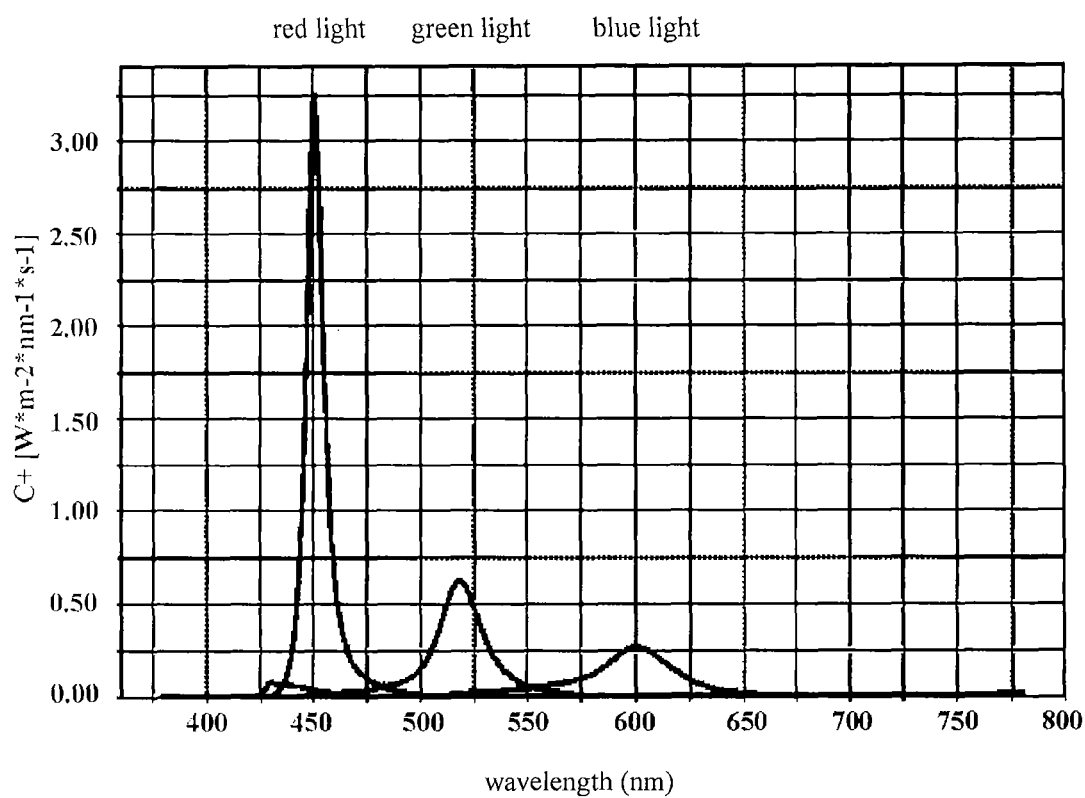
FIG. 4 schematically shows a simulated intensity distribution for red, green, and blue light outputs of a display substrate according to an embodiment of the present disclosure.

As an example, in case that the respective layers in the display substrate are formed using the materials listed above, the thin film encapsulation layer formed by alumina may have a thickness of about 100 nm, and in the layer of parylene, the respective portions that are configured to output red, green and blue light after resonance enhancement may be formed respectively to be approximately 166 nm, 120 nm, and 75 nm. The simulated intensity distribution for red, green, and blue light output in such a display substrate is shown in FIG. 4, where the abscissa indicates the wavelength of light, and the ordinate indicates the intensity of light. It should be noted that the present disclosure is only focused on the color purity of red, green and blue light, rather than the intensity thereof. Thus, the same excitation conditions (e.g. the same excitation current density) are selected for different light emitting layers in the simulation results shown in FIG. 4, thereby resulting in a peak intensity of red light higher than those of green and blue light. However, this does not represent any limitation on the present disclosure. In fact, having benefited from teachings of the present disclosure, those skilled in the art will readily appreciate that actual excitation conditions may be varied for different light emitting layers, in order to achieve a desired intensity of red, green, and blue light emission. Further, as shown in Table 1 below, the chromaticity coordinates of red, green, and blue light output from such a display substrate are relatively pure, thereby facilitating light output of a wide color gamut, for example, up to 120% in the NTSC color gamut.

|       | CIEx  | CIEy  | Y    |
|-------|-------|-------|------|
| green | 0.117 | 0.771 | 79.6 |
| blue  | 0.146 | 0.032 | 66.8 |
| red   | 0.620 | 0.281 | 25.0 |

Table 1 exemplary chromaticity coordinates of red, green, and blue light output from the display substrate.

In view of the above simulation results, it is also possible to provide a color filter sub-unit of a respective color, in particular, a red color filter sub-unit, so as to further improve the purity of red light, thereby allowing the color gamut to be further improved. For example, referring to Table 2 below, the chromaticity coordinate values of respective colors as shown in Table 1 after color filtering by the additional red color filter sub-unit are shown. It can be seen that after the additional color filtering, the chromaticity coordinates of red light becomes more pure, which helps to further increase the color gamut of the final output light.

|       | CIEx  | CIEy  | Y    |
|-------|-------|-------|------|
| green | 0.117 | 0.771 | 79.6 |
| blue  | 0.146 | 0.032 | 66.8 |
| red   | 0.650 | 0.341 | 66.0 |

Table 2 exemplary chromaticity coordinates of red, green, and blue light as shown in Table 1 after additional color filtering by the red color filter sub-unit.

According to another aspect of the present disclosure, a display device is also provided. Specifically, the display device comprises the display substrate described in any of the above embodiments. Since the specific implementation of the display device is the same as that of the display substrate described above, it will not be described herein.

Figure 5:
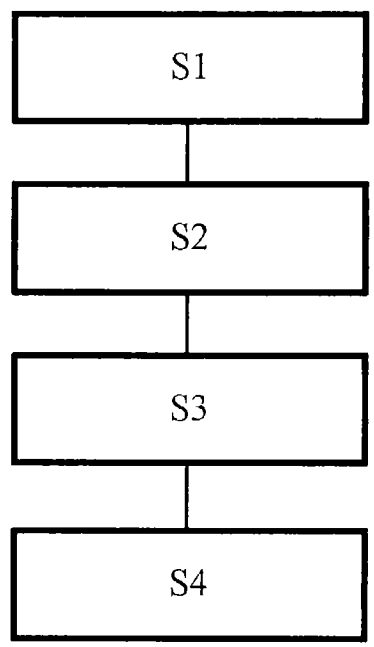
FIG. 5 schematically shows a flow chart of a method for fabricating a display substrate according to an embodiment of the present disclosure.

According to yet another aspect of the present disclosure, a method for fabricating a display substrate is also provided. Referring to FIG. 5, a flow chart of a method for fabricating a display substrate according to an embodiment of the present disclosure is schematically illustrated. Specifically, the fabricating method may comprise the following steps: S1, providing a first transparent electrode and a second reflective electrode opposite to each other; S2, forming a light emitting layer between the first transparent electrode and the second reflective electrode; S3 forming an organic material layer on a side of the first transparent electrode away from the light emitting layer, such that the organic material layer comprises a plurality of organic material portions arranged in an array, and each organic material portion comprises more than one organic material sub-portion; and S4, forming a transflective layer on a side of the organic material layer away from the light emitting layer, wherein each organic material sub-portion in each organic material portion is further formed to have a different thickness in a direction perpendicular to an extending surface of the organic material layer, such that a distance between a portion of the second reflective electrode and a portion of the transflective layer corresponding to each organic material sub-portion is different, thereby emitting light of a different color from each organic material sub-portion.

According to a specific implementation, in the method for fabricating the display substrate provided above, an organic material film may be formed firstly on a side of the first transparent electrode away from the light emitting layer by a spin coating process, and after that, the organic material film may be imprinted by a nano-imprint process into a plurality of organic material portions arranged in an array. During the imprint process, a separate mask is not required, and this does not cause any damage to the entire device. Further optionally, according to other exemplary embodiments, formation of the transflective layer on the side of the organic material layer away from the light emitting layer may be completed by an evaporation process. It should be noted that although specific formation processes such as spin coating, nano-imprinting, evaporation, etc. are mentioned in the above description, the present disclosure should in no way be limited thereto. In practical applications, those skilled in the art should be able to flexibly select any suitable forming process depending on the particular implementations. For example, in an alternative embodiment, the transflective layer may also be formed on the upper side of the organic material layer by other coating processes. In addition, in other alternative embodiments, the organic material layer may also be formed into a plurality of organic material portions arranged in an array, for example, by a photolithography process or other mask deposition process, and each organic material portion comprises several sub-portions of different thicknesses. The present disclosure is intended to cover all such equivalent technical solutions.

In summary, embodiments of the present disclosure provide a display substrate and a fabricating method thereof. In particular, in embodiments, by introducing a microcavity structure into the display substrate, in particular, a plurality of microcavity structures having different cavity lengths, light of different colors are output from the display substrate with the aid of resonance enhancement effect, which facilitates full color display. In addition, by virtue of the selectivity of the wavelength (or color) of light by the microcavity, and the resonance enhancement effect on intensity, not only more pure red, green and blue output can be obtained, thereby improving the color gamut, but also transmittance of the overall display substrate can be improved. Typically, as compared to conventional display substrates (the light transmittance thereof is typically only 25%) composed of white light and a color film substrate, light transmittance of the substrate according to embodiments of the present disclosure can be about 60% to 70%.

Those skilled in the art will appreciate that embodiments having the term "substantially" herein may also comprise embodiments having terms such as "completely", "entirely", "all", and the like. Thus, in an embodiment, the adjectives "substantially" can also be omitted. Where applicable, the term "substantially" may also relate to 90% or higher, such as 95% or higher, particularly 99% or higher, even more particularly 99.5% or higher, including 100%. The term "comprising" also includes the embodiment in which the term "comprising" means "consisting of." The term "and/or" particularly relates to one or more of the items mentioned before and after "and/or". For example, the phrase "item 1 and/or item 2" and similar phrases may relate to one or more of items 1 and 2. The term "comprising", in one embodiment may mean "consisting of," but in another embodiment may mean "comprising at least the defined species and optionally one or more other species."

In addition, the terms first, second, third, etc. in the specification and the claims are used to distinguish between similar elements, and are not necessarily used to describe the sequence or chronological order. It is to be understood that the terms so used are interchangeable, where appropriate, and that embodiments of the present disclosure described herein can operate in other sequences than those described or illustrated herein.

Herein, the description of the device is performed during operation, among other things. As will be apparent to those skilled in the art, the present disclosure is not limited to the method of operation or the device in operation.

It should be noted that the above-mentioned embodiments are illustrative and not limiting, and that those skilled in the art will be able to design many alternative embodiments without departing from the scope of the appended claims. In the claims, any reference signs placed between parentheses shall not be construed as a limitation. Use of the verb "comprise" and its conjugations does not exclude the presence of elements or steps other than those stated in the claims. The article "a" or "an" does not exclude a plurality. The present disclosure can be implemented by means of hardware comprising several discrete components, and by means of a suitably programmed computer. In the device claim enumerating several means, several of these means can be embodied by a same item. The mere fact that certain measures are recited in mutually different dependent claims does not indicate that a combination of these measures cannot be used to advantage.

The present disclosure is also applicable to devices including one or more of the characterizing features described in the specification and/or illustrated in the drawings. The present disclosure is also directed to a method or process that includes one or more of the characterizing features described in the specification and/or illustrated in the accompanying drawings.

The various aspects discussed in this patent can be combined to provide additional advantages. Additionally, some of the features may form the basis of one or more divisional applications.

LIST OF REFERENCE NUMERALS

100 200 300 display substrate
101 201 301 first transparent electrode
102 202 302 second reflective electrode
103 203 303 light emitting layer
2031 first light emitting sub-layer
2032 second light emitting sub-layer
2033 third light emitting sub-layer
104 304 organic material layer
1040 2040 3040 organic materials portion
2041 first organic material sub-portion
2042 second organic material sub-portion
2043 third organic material sub-portion
105 205 305 transflective layer
1060 2060 color filter unit
2061 first color filter sub-unit
2062 second color filter sub-unit
2063 third color filter sub-unit
307 first encapsulation layer
308 second encapsulation layer
309 electron injection layer
309' electron transport layer
310 hole injection layer
310' hole transport layer.

The invention claimed is:

1. A display substrate, comprising:
a first transparent electrode and a second reflective electrode opposite to each other;
a light emitting layer between the first transparent electrode and the second reflective electrode;
an organic material layer on a side of the first transparent electrode away from the light emitting layer; and
a transflective layer on a side of the organic material layer away from the light emitting layer,
wherein the organic material layer comprises a plurality of organic material portions in an array,
wherein each of the plurality of organic material portions comprises more than one organic material sub-portion, and
wherein each of the more than one organic material sub-portion in each of the plurality of organic material portions has a different thickness in a direction perpendicular to an extending surface of the organic material layer, such that a distance between a portion of the second reflective electrode and a portion of the transflective layer corresponding to each of the more than one organic material sub-portion is different, thereby emitting light of a different color from each of the more than one organic material sub-portion,
wherein the display substrate further comprises a first encapsulation layer between the first transparent electrode and the organic material layer.

2. The display substrate according to claim 1, wherein the transflective layer is in direct contact with the organic material layer.

3. The display substrate according to claim 1, further comprising:
a plurality of color filter units on a side of the transflective layer away from the light emitting layer, each of the plurality of color filter units comprising more than one color filter sub-unit,
wherein an orthographic projection of each of the more than one color filter sub-unit on the organic material layer coincides with a respective one of the more than one organic material sub-portion.

4. The display substrate according to claim 1, further comprising:
a second encapsulation layer on a side of the transflective layer away from the light emitting layer.

5. The display substrate according to claim 1, wherein the organic material layer comprises parylene, polydimethylsiloxane or polymethyl methacrylate.

6. The display substrate according to claim 1, wherein the transflective layer comprises a distributed Bragg mirror, a MgAg layer, an Al layer or an Au layer.

7. A display device, comprising the display substrate according to claim 1.

8. The display device according to claim 7, wherein the transflective layer is in direct contact with the organic material layer.

9. The display device according to claim 7, wherein the display substrate further comprises:
a plurality of color filter units on a side of the transflective layer away from the light emitting layer, each of the plurality of color filter units comprising more than one color filter sub-unit,
wherein an orthographic projection of each of the more than one color filter sub-unit on the organic material layer coincides with a respective one of the more than one organic material sub-portion.

10. The display device according to claim 7, wherein the display substrate further comprises:
a second encapsulation layer on a side of the transflective layer away from the light emitting layer.

11. The display device according to claim 7, wherein the more than one organic material sub-portion comprises a first organic material sub-portion, a second organic material sub-portion, and a third organic material sub-portion.

12. A display substrate, comprising:
a first transparent electrode and a second reflective electrode opposite to each other;
a light emitting layer between the first transparent electrode and the second reflective electrode;
an organic material layer on a side of the first transparent electrode away from the light emitting layer; and
a transflective layer on a side of the organic material layer away from the light emitting layer,
wherein the organic material layer comprises a plurality of organic material portions in an array,
wherein each of the plurality of organic material portions comprises more than one organic material sub-portion, and
wherein each of the more than one organic material sub-portion in each of the plurality of organic material portions has a different thickness in a direction perpendicular to an extending surface of the organic material layer, such that a distance between a portion of the second reflective electrode and a portion of the transflective layer corresponding to each of the more than one organic material sub-portion is different, thereby emitting light of a different color from each of the more than one organic material sub-portion, and
wherein the more than one organic material sub-portion comprises a first organic material sub-portion, a second organic material sub-portion, and a third organic material sub-portion.

13. The display substrate according to claim 12,
wherein the light emitting layer comprises a first light emitting sub-layer, a second light emitting sub-layer, and a third light emitting sub-layer in a stack, and
wherein the first light emitting sub-layer is configured to emit red light, the second light emitting sub-layer is configured to emit green light, and the third light emitting sub-layer is configured to emit blue light.

14. The display substrate according to claim 13, wherein respective thicknesses of the first organic material sub-portion, the second organic material sub-portion, and the third organic material sub-portion in the direction perpendicular to the extending surface of the organic material layer are chosen such that red light, green light, and blue light are emitted out from the first organic material sub-portion, the second organic material sub-portion, and the third organic material sub-portion respectively.

15. A method for fabricating a display substrate, comprising:
providing a first transparent electrode and a second reflective electrode opposite to each other;
forming a light emitting layer between the first transparent electrode and the second reflective electrode;
forming an organic material layer on a side of the first transparent electrode away from the light emitting layer, the organic material layer comprising a plurality of organic material portions in an array, wherein each of the plurality of organic material portions comprising more than one organic material sub-portion; and
forming a transflective layer on a side of the organic material layer away from the light emitting layer,
wherein each of the more than one organic material sub-portion in each of the plurality of organic material portions is further formed to have a different thickness in a direction perpendicular to an extending surface of the organic material layer, such that a distance between a portion of the second reflective electrode and a portion of the transflective layer corresponding to each of the more than one organic material sub-portion is different, thereby emitting light of a different color from each of the more than one organic material sub-portion.

16. The method according to claim 15, wherein the organic material layer is formed on the side of the first transparent electrode away from the light emitting layer by a spin coating process.

17. The method according to claim 16, wherein the organic material layer is imprinted by a nano-imprint process into the plurality of organic material portions in the array.

18. The method according to claim 15, wherein the transflective layer is formed on the side of the organic material layer away from the light emitting layer by an evaporation process.

* * * * *